Oct. 18, 1966 E. J. MILLER ET AL 3,279,955
METHOD OF FORMING ELECTROPLATED THERMOELECTRIC JUNCTION AND RESULTANT ARTICLE
Filed Jan. 8, 1963
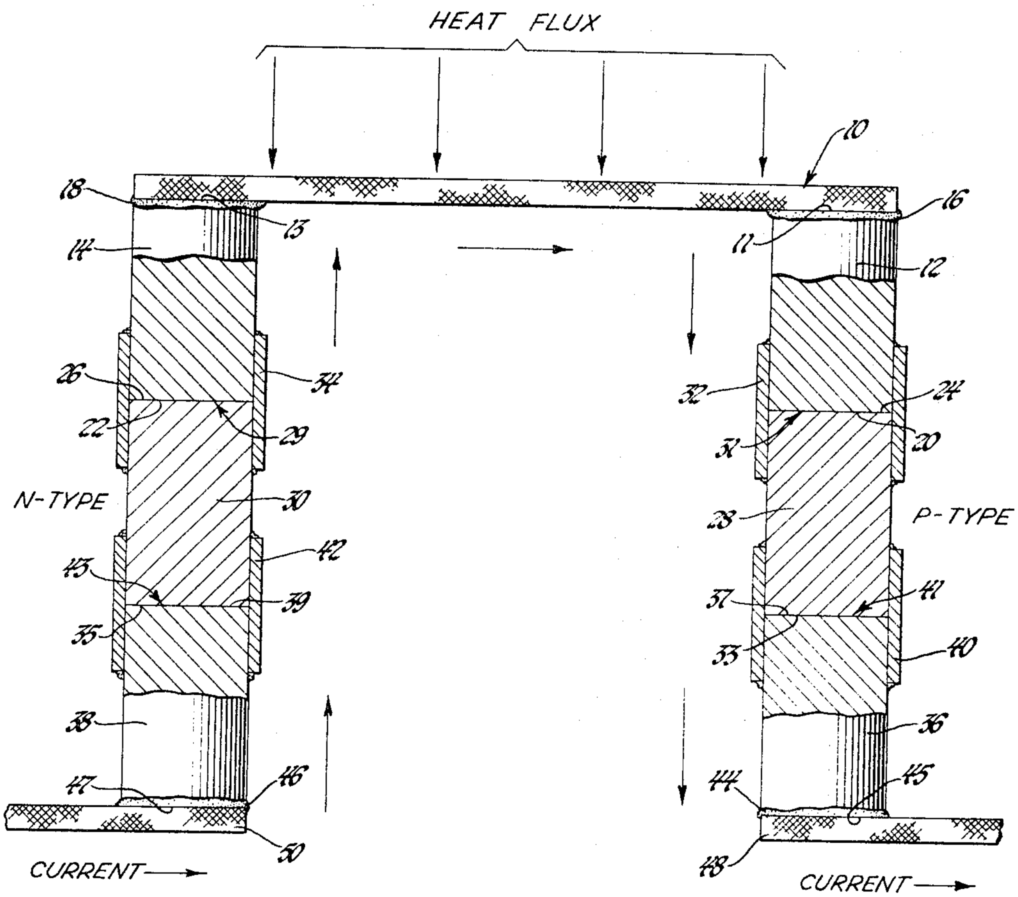
INVENTORS
Edwin J. Miller, &
BY Dennis E. O'Hora
B. N. Shampo
ATTORNEY United States Patent Office 3,279,955
Patented Oct. 18, 1966

3,279,955
METHOD OF FORMING ELECTROPLATED THERMOELECTRIC JUNCTION AND RESULTANT ARTICLE

Edwin J. Miller, Detroit, and Dennis E. O'Hora, Farmington, Mich., assignors to General Motors Corporation, Detroit, Mich., a corporation of Delaware
Filed Jan. 8, 1963, Ser. No. 250,054
12 Claims. (Cl. 136—205)

This invention relates generally to thermocouple assemblies and to a method of producing such assemblies for use in thermoelectric devices in an array of applications including heating, cooling and electric power generation. More particularly, this invention relates to a method of making thermoelectric junctions having low thermal and electrical resistance and good mechanical strength at high operating temperatures.

In heating, cooling or electric generating systems utilizing the Peltier or Seebeck effects, thermocouple assemblies consisting of pairs of dissimilar semiconductor thermoelectric elements are electrically interconnected in an arrangement, such as to either pump heat or extract heat from a particular environment upon passing a direct current through the elements, or to generate electricity upon subjecting the opposite ends thereof to different temperatures.

The individual thermocouple modules in the thermoelectric devices used in such systems are provided with a plurality of thermoelectric junctions between the semiconductor elements and their associated terminal members. In such devices it is desirable to provide junctions which are strong and rigid, and which will result in relatively unbreakable joints. Naturally it is very important to the operability of these devices that the junctions have very low thermal and electrical resistance. Also, it is particularly important in thermoelectric power generation applications that the junctions have high mechanical strength and low electrical resistance at the high operating temperatures associated with these applications.

Several methods of forming thermoelectric junctions between thermoelectric elements and associated terminal members have been developed. Among the most commonly used methods are brazing, soldering and fusing the semiconductor elements to the associated terminal members, and lastly, forming pressure contacts by means of mechanical locking or similar means.

However, each of the above methods of forming thermoelectric junctions has certain drawbacks in particular applications. For instance, although brazed or soldered junctions usually exhibit very low thermal and electrical resistance, they are relatively weak mechanically, and the junction is easily fractured. This is particularly true with many commonly used crystalline semiconductor materials which are quite brittle and very susceptible to cracking during the junction forming operation. If cracking does not occur during the joining operation, the semiconductor element is usually stressed to the extent that thermal cycling during the normal operation of the device will induce cracking. Also, soldered or brazed junctions are often unsatisfactory for use in electric power generation, since the soldered or brazed bond may melt at the higher temperatures associated with this application.

Thermoelectric junctions formed by fusing the semiconductor element to the associated terminal members generally exhibit the same susceptibility to cracking as soldered or welded junctions. In addition, the high temperatures employed in forming fused junctions often result in a decrease in the efficiency of the semiconductor element due to the transformation of the semiconductor material at the fused junction. Pressure contact thermoelectric junctions formed by mechanical locking are usually less susceptible to cracking. However, this type of junction generally exhibits higher thermal and electrical resistance than the other type of junction previously mentioned.

It is therefore a principal object of the present invention to provide a method of forming thermoelectric junctions having low thermal and electrical resistance, high mechanical strength and good high temperature operating characteristics. It is another object of the present invention to provide a thermocouple assembly having high strength, low resistance thermoelectric junctions for use in thermoelectric power generation applications. It is a further object to provide a thermocouple assembly wherein the upper operating temperature is limited by the volatilization rates, oxidation rates, melting points and thermoelectric properties of the semiconductor materials and not by the solder materials as in the past.

In accordance with the present invention, these and other objects are attained by electroplating metal collars in situ about the thermoelectric junctions formed between the semiconductor elements and the associated terminal members to thereby provide a thermocouple assembly having junctions of high mechanical strength, low thermal and electrical resistance and good high temperature operating characteristics.

Other features and advantages of the invention will be apparent from the following description of certain embodiments thereof, taken in conjunction with the accompanying drawing which shows a vertical elevational view, with parts broken away and in section, of a thermoelectric assembly.

The drawing illustrates a thermocouple assembly suitable for producing electrical current from heat. A flexible metal strap 10 is joined at opposite ends to cylindrical metal terminal members 12 and 14 made of copper, iron, steel or other suitable electrical conducting materials. The strap is similarly made of a good thermal and electrical conducting material such as copper, iron, aluminum or the like. Flexibility may be imparted to the strap by forming it of braided strands of one or more of these metals. The end surfaces 11 and 13 of the terminal members 12 and 14, respectively, are bonded to the strap in good thermal and electrical contact by any suitable means, such as silver soldering at 16 and 18. The opposite end surfaces 20 and 22 of the terminal members 12 and 14, respectively, are in good thermal and electrical contact with corresponding end surfaces 24 and 26 of opposite conductivity type cylindrical semiconductor elements 28 and 30, respectively. The cylindrical terminal members have essentially the same diameter as the cylindrical semiconductor elements. Thus, the terminal member 14 forms a thermoelectric junction 29 with an n-type semiconductor element 30 made of a material such as lead telluride, germanium telluride, bismuth telluride or the like. Likewise, terminal member 12 similarly forms a thermoelectric junction 31 with a p-type semiconductor element 28 which is made of a suitable material such as lead telluride, germanium telluride, bismuth telluride or a mixture of one or more of these materials, such as a composition consisting of 95 mole percent germanium telluride and 5 mole percent bismuth telluride. The junctions 29 and 31 are maintained in tight, intimate thermal and electrical contact by means of electroplated metal collars 32 and 34 which surround the periphery of the junctions 29 and 31, respectively, and overlap the adjacent cylindrical surfaces of the terminal members and semiconductor elements. The method of forming these collars is hereinafter more fully explained.

Similarly, the opposite end surfaces 33 and 35 of the semiconductor elements 28 and 30 are maintained in good thermal and electrical contact with the end surfaces 37 and 39 of cylindrical metal terminal members 36 and 38, respectively, by means of electroplated metal collars 40 and 42, thereby forming thermoelectric junctions 41 and 43. The opposite end surfaces 45 and 47 of terminal members 36 and 38 are in turn soldered at 44 and 46 to flexible metal terminal straps 48 and 50, respectively. The terminal straps may be connected in series with other similar thermocouple assemblies of the same general configuration to supply current to an electrical load. For instance, a thermoelectric power generator may be made by joining a plurality of these thermocouple assemblies together in series. If heat is applied to the metal strap 10 from some external heat source, and if a temperature differential is maintained between the hot thermoelectric junctions 29 and 31 and the cool thermoelectric junctions 41 and 43, the thermocouple assembly is capable of delivering power to a load.

As previously mentioned, the thermoelectric junctions are formed by maintaining the end surfaces of the semiconductor elements in good thermal and electrical contact with the adjacent terminal members by means of electroplated metal collars. Several techniques of forming metal collars such as vapor deposition, chemical deposition, chemical displacement or vapor decomposition have been used in the past for a wide variety of applications. However, we have found that electroplating of the metal collars is the technique best suited for our application of forming thermoelectrical junctions since this method provides a very good bond between the elements and members and is relatively inexpensive and easy to employ. Also, the metal used in forming the collar is not limited to any one material but will depend on the application for which the thermocouple assembly will be used. Thus, any metal from the group consisting of nickel, rhodium, silver, copper or iron may be used in our application.

Some of the factors which need be considered in selecting the proper metal for the electroplating operation are process temperature, device operating temperature, metal melting point, deleterious effects due to diffusion and the coefficient of expansion of the metal. As previously mentioned, several metals may be used in forming the collars. However, we selected nickel for use in a thermocouple assembly for thermoelectric power generation since a material having a relatively high melting point is necessary for this application due to the relatively high temperature involved. The melting point of nickel is 1455° C., which is considerably above the maximum operating temperature of the bismuth telluride, germanium telluride and lead telluride semiconductor elements generally used in this application. The highest useful operating temperature normally encountered in thermocouples for thermoelectric power generation is about 700° C. for germanium telluride. In addition, the linear coefficient of thermal expansion of nickel is slightly less than that of steel, which is sometimes used as the terminal member material, or that of the semiconductor materials previously mentioned. This means the nickel collars, upon heating, will not expand as greatly as the semiconductor elements and the steel terminal rods. Therefore, a slight compressive force will be exerted on the thermoelectric junctions formed by the terminal members and the semiconductor elements. Since the above-mentioned semiconductor materials are much stronger under compression that under tension, it is desirable to subject them to compressive stresses rather than tensile stresses.

We have developed the following procedure for forming the nickel collars around the thermoelectric junctions. The metal terminal members should be washed with water or cleaned in another suitable manner to remove any impurities or residues which may be present on the surfaces of the members that might interfere with the electroplating operation. If the metal terminal members are formed of a material which is not readily electroplated with nickel, the members are given a very thin nickel coating in a nickel flash plating bath to facilitate deposition of the electroplated nickel collars in the subsequent electroplating operation. The nickel flash plate also promotes even plating of the collars over the junctions formed by the members and elements. However, if the terminal members are made of copper, steel, iron or nickel, flash plating is generally not necessary, as the surfaces of these metals are readily plated with nickel in the subsequent collar plating operation.

The nickel flash plate may be deposited on the metal terminal members by any standard electroplating method. The members are momentarily immersed in a standard nickel electroplating bath so that a nickel coating is deposited to a thickness which preferably is not greater than .00001 inch. The terminal members function as the cathode, and a pure nickel anode is provided. The following aqueous electroplating bath was proved satisfactory for our use:

| | Ounces per gallon |
|---|---|
| Nickel sulfate | 20 |
| Nickel chloride | 23 |
| Boric acid | 5.3 |
| Nonionic wetting agent, trace. | |
| Water, balance. | |

The bath has a pH of less than 2 and is maintained at a temperature of at least 60° C. The electrolyte is moderately agitated by any suitable means, and a cathode current density of about 40 milliamperes per square centimeter will cause a coating of the desired thickness to be deposited on the metal terminal members.

As is well known, the surfaces of semiconductor elements formed of materials such as germanium telluride, lead telluride and bismuth telluride readily oxidize upon exposure to the atmosphere. This oxide surface layer inhibits the formation of a low resistance thermoelectric junction. Therefore, it is desirable to remove the oxide layer from the surfaces of the semiconductor elements prior to the formation of the junction. We have found that this removal may be effectively accomplished by cleaning the elements in an electropolishing operation.

Each of the semiconductor elements is treated in a suitable electropolishing bath developed for that particular element. For instance, we have found the following procedure suitable for treating p- and n-type lead telluride semiconductors.

An aqueous electrolytic bath having the following composition is prepared:

| | Grams per liter |
|---|---|
| Sodium potassium tartrate | 22.5 |
| Sodium carbonate | 15.0 |
| Sodium hydroxide | 3.75 |
| Copper cyanide | 22.5 |
| Sodium cyanide | 37.5 |
| Water, balance. | |

The lead telluride semiconductor element is connected by any suitable means to an electric power source and functions as the anode in the bath. A copper cathode also is connected to the power source. The bath is maintained at a temperature of about 60° C. The anode and cathode are immersed in the bath and the lead telluride anode is subjected to very rapid agitation by any suitable means. An anode current density of about 400 milliamperes per square centimeter is maintained in the bath to effect the removal of the oxide layer on the surfaces of the semiconductor elements. After two minutes the lead telluride anode is removed from the bath and is immediately subjected to a water rinse for about one minute to remove the retained electrolyte from the surfaces of the elements.

As previously mentioned, the semiconductor surfaces rapidly oxidize on exposure to the atmosphere. Therefore, in order to prevent this formation of the oxide layer on the electropolished elements, we have found it desirable to treat the element with a nickel flash plate coating immediately after the washing step is completed. Thus, the element is immediately transferred to the nickel flash plating bath similar to that used in flash plating the metal terminal members, and the same procedure is used to coat the semiconductor elements with a thin layer of nickel, preferably not greater than .00001 inch in thickness.

The same procedure previously described for electropolishing lead telluride elements may be followed in electropolishing p- and n-type bismuth telluride semiconductor elements. However, we have found that by increasing the concentration of sodium hydroxide in the bath to about 6.0 grams per liter, improved results are attained in treating the bismuth telluride elements. The procedure followed subsequent to the electropolishing of the elements, i.e., the immediate water wash and flash plating of the elements with nickel, is accomplished in the manner hereinbefore described in connection with the treatment of the lead telluride elements.

Similarly, p-type germanium telluride and p-type semiconductor elements consisting of 95 mole percent germanium telluride and 5 mole percent bismuth telluride may be electropolished using an aqueous electrolytic bath containing either 5% by weight of potassium hydroxide or 85% by weight of phosphoric acid. However, we have found that best cleaning results are obtained by using a potassium hydroxide bath. In the latter case, the semiconductor element functions as the anode and a platinum cathode is provided. The bath is kept at a temperature of about 25° C. and the electrodes are immersed in the bath for approximately two minutes. An anode current density of about 2 amperes per square centimeter is maintained in the bath. The semiconductor anode is very rapidly agitated for about two minutes by any suitable means. After this time the semiconductor element is removed from the bath and the retained electrolyte is immediately rinsed off the element with running water for approximately two minutes. Immediately after the rinse, the element is given a nickel flash plate coating utilizing the same procedure as previously mentioned for the other components.

After the flash plating of the terminal members and semiconductor elements has been completed, thermocouple arms are formed by fixturing a terminal member at both ends of each element by any suitable means, such as a mechanical clamp. Masking tape or other appropriate material is placed around the center portion of the semiconductor element and the outermost ends of the terminal members. The cylindrical surfaces of the members and elements adjacent the junctions are left unmasked.

Since the elements and the terminal members are physically handled in the masking and fixturing steps, we have found it desirable in some cases to clean the fixtured assembly prior to electroplating the nickel collars around the junctions, thereby removing any contamination on the exposed surfaces resulting from such handling. This may be conveniently accomplished by any suitable method, such as electropolishing the fixtured assembly in an aqueous electrolytic bath containing approximately 85% by weight phosphoric acid. The bath is maintained at a temperature of about 25° C., and the fixtured thermocouple arm anode and a stainless steel cathode are immersed in the bath for about two minutes. An anode current density of about 3 amperes per square centimeter is maintained in the bath, and the anode is moderately agitated. After the fixtured assembly has been suitably cleaned, it is removed from the bath and transferred to the nickel plating bath where the collars are formed about the junctions.

The collars may be plated on the unmasked junctions by any standard electroplating technique, such as with the bath and procedure previously described in connection with the nickel flash plating step, except that the plating is carried out for a longer period of time. The fixtured assembly is maintained in the bath for a sufficient time to build up an electroplated collar of the desired thickness on the unmasked surfaces. The thickness of the collar deposited will be determined by the structural strength desired. For most applications, a collar having a thickness of about 0.5 millimeter is satisfactory.

Any other suitable electroplating bath may be used in depositing the nickel collars. For instance, a bath having the following composition has proved satisfactory for our use.

| | Ounces per gallon |
|---|---|
| Nickel sulfamate | 60 |
| Boric acid | 4 |
| Anti-pit compound | 0.05 |
| Water, balance. | |

The pH of the latter bath ranges from approximately 3 to 5. The bath is maintained at a temperature of about 55° C. A pure nickel anode and the fixtured thermocouple arm cathode are connected to an external power supply and immersed in the bath for about eight hours. The cathode is moderately agitated by any suitable means. By maintaining a cathode current density of about 4 milliamperes per square centimeter for approximately eight hours, a nickel collar will be deposited about the unmasked junctions to a thickness of about 0.5 millimeter in thickness. Naturally, the current density may be increased to achieve a shorter plating time.

Thus, the nickel collars are simultaneously electroplated in situ over the cylindrical surfaces of the semiconductor elements and terminal members adjacent the thermoelectric junctions. By thus forming the collars simultaneously in situ so that they overlap both the elements and the terminal members and are tightly bonded thereto, we have found that a securely bound thermoelectric junction of tight intimate contact is obtained. This tight contact insures good thermal and electrical junction conductance and high junction mechanical strength.

After a collar of suitable thickness has been built up on the unmasked cylindrical surfaces adjacent the thermoelectric junctions, the thermocouple arm is removed from the nickel plating bath. The masking material is stripped from the arm and the exposed nickel flash plate may be removed from the semiconductor element and associated terminal members by either electrolysis or abrasion. However, since thermal and electrical conductance through the very thin plate coating is negligible, it is generally unnecessary to remove it. For instance, flash plates of approximately $3\times10^{-6}$ centimeters in thickness may be tolerated on a semiconductor element of 0.6 centimeter in diameter without significantly affecting the thermoelectric efficiency of the element. In some instances it may be desirable to leave the flash coating on the semiconductor elements to inhibit the volatilization or oxidation of some tellurium-containing semiconductor elements at high temperatures.

Upon completion of the nickel collar plating operation, the outermost ends of the terminal members of p- and n-type thermocouple arms are electrically connected by means of flexible metal straps to complete the formation of the thermocouple module. The straps may be connected to the end surfaces of the terminal members by any suitable means, such as silver soldering.

In the above manner, we prepared n- and p-type thermocouple arms using cylindrical n-type lead telluride and p-type germanium telluride semiconductor elements and steel terminal members. The diameters and lengths of the cylindrical elements and members were 0.6 centimeter. A nickel flash plate of $3\times10^{-6}$ centimeters in thickness was deposited on the members and elements using the electrolytic bath and steps hereinbefore described. The nickel plated junction collars were formed to a thickness of 0.5 millimeter utilizing the nickel sulfamate bath and procedure described above. The terminal members were subsequently bonded to flexible iron straps by silver soldering, and the n- and p-type thermocouple arms were electrically connected in the manner previously discussed. The nickel flash plate was removed from the elements by abrasion.

Test results showed that the effective junction resistances of this thermocouple were less than $2\times10^{-5}$ ohm-centimeters$^2$ at operating temperatures as high as 600° C. Also, this thermocouple was subjected to thermal cycling 130 times between temperatures of 600° C. and 100° C. without any fracturing of the junctions or any noticeable change in junction resistance. Similar results were obtained using nickel plated junction collars in connection with metal terminal members made of rhodium, silver, copper or iron and p- and n-type bismuth telluride semiconductor elements and elements formed of 95 mole percent germanium telluride and 5 mole percent bismuth telluride.

Intentional breaking of the plated junction collar thermocouples demonstrated that these couples are much stronger and less susceptible to breaking from physical handling than soldered junction thermocouples. The soldered junction thermocouples were relatively easily fractured at the junctions. On the other hand, the plated junction collar thermocouples fractured in the bulk semiconductor element region away from the junction, and considerably more force was required to fracture the assemblies.

Thus, it will be seen that thermocouples made by the above-described method have high strength and low thermal and electrical resistance. In addition, the thermocouple junctions formed by our process exhibit very low resistance when used at high temperatures in thermoelectric power generating devices. The upper operating temperature for these devices utilizing the thermocouple assemblies produced in accordance with the present invention is limited only by volatilization rates, oxidation rates, melting points and the desired thermoelectric properties of the particular semiconductor elements used, and not by solder or welding materials as in the past.

While we have described our invention in terms of particular embodiments, it is not intended to be limited thereby; and it should be understood that other variations will be apparent to those skilled in the art and are within the intended scope of our invention as defined by the following claims.

We claim:

1. A thermoelectric assembly comprising a thermoelectric element in good thermal and electrical contact with a metal member, said element being bonded to said member by means of an electroplated metal collar.

2. A thermocouple assembly comprising a high strength, low resistance thermoelectric junction, said junction being formed by a semiconductor element in good thermal and electrical contact with a metal terminal member, said element being bonded to said member by means of an electroplated metal collar surrounding the periphery of said junction and bonded to said element and said member.

3. A thermoelectric power-generating device comprising a high strength, low resistance thermoelectric junction, said junction being formed by a semiconductor element in good thermal and electrical contact with a metal terminal member and an electroplated metal collar bonded to said element and said member at and immediately adjacent said junction.

4. A thermocouple assembly comprising an n-type semiconductor element positioned between two metal terminal members and in good thermal and electrical contact therewith to form hot and cold thermoelectric junctions, a p-type semiconductor element positioned between two metal terminal members and in good thermal and electrical contact therewith to thereby form hot and cold thermoelectric junctions, said elements being bonded to said members by means of electroplated metal collars surrounding the periphery of said junctions, means for electrically connecting said members adjacent said hot junctions, and means for electrically connecting said members adjacent said cold junctions to an external source of electrical power or electrical load.

5. A thermocouple assembly having a plurality of thermoelectric junctions of high mechanical strength and low thermal and electrical resistance, said assembly comprising a generally cylindrical n-type semiconductor element positioned between and in good thermal and electrical contact with flat end faces of two generally cylindrical metal terminal members, thereby forming a generally cylindrical n-type thermocouple arm having a hot and a cold thermoelectric junction at opposite ends of said n-type element, a generally cylindrical p-type semiconductor element positioned between and in good thermal and electrical contact with flat end faces of two generally cylindrical metal terminal members, thereby forming a generally cylindrical p-type thermocouple arm having a hot and a cold thermoelectric junction at opposite ends of said p-type element, said elements being secured to said members by means of electroplated metal collars bonded thereto, said collars overlapping and being in tight contact with the cylindrical surfaces of said members and said elements adjacent said junctions, a flexible metal strap in electrical contact with said members of said arms contiguous said hot thermoelectric junctions, and means for electrically connecting said members of said arms contiguous said cold junctions to an external source of electrical power or electrical load.

6. A thermoelectric assembly having a plurality of thermoelectric junctions of high mechanical strength and low thermal and electrical resistance, said assembly comprising an n-type semiconductor element positioned between and in good thermal and electrical contact with two metal terminal members, the contacting surfaces of said n-type element and said members forming hot and cold thermoelectric junctions, and a p-type semiconductor element positioned between and in good thermal and electrical contact with two metal terminal members, the contacting surfaces of said members and said p-type element forming hot and cold thermoelectric junctions, each of said elements being formed of at least one metal compound selected from the group consisting of germanium telluride, lead telluride and bismuth telluride, each of said members being formed of at least one metal selected from the group consisting of nickel, copper, iron and steel, said elements being secured to said members by means of electroplated metal collars overlapping the surfaces of said members and said elements adjacent said junctions, each of said collars being formed from at least one metal selected from the group consisting of nickel, rhodium, silver, copper and iron, said members adajcent said hot thermoelectric junctions being connected to flexible metal terminal straps, said straps being made from at least one metal selected from the group consisting of copper, iron and steel.

7. A thermoelectric power-generating device comprising a plurality of thermocouple assemblies electrically connected in series and having a plurality of hot and cold thermoelectric junctions of high mechanical strength and low electrical resistance at high operating temperatures, said junctions being formed by opposite conductivity-type semiconductor elements in good thermal and electrical contact with metal terminal members, said elements being bonded to said members by means of electroplated metal collars, means for electrically connecting said members adjacent said hot thermoelectric junctions, means for electrically connecting said members adjacent said cold thermoelectric junctions, means for conducting electrical current from said assemblies to a load and means for heating said hot thermoelectric junctions.

8. A method of fabricating a thermocouple assembly which comprises electroplating a metal collar around a thermoelectric junction formed between a thermoelectric element in good thermal and electrical contact with a metal terminal member, said collar thereby bonding said element to said member.

9. A method of forming a thermocouple assembly having a high mechanical strength, low resistance thermoelectric junction which comprises electroplating a metal collar around the periphery of said junction formed between a semiconductor element in good thermal and electrical contact with a metal terminal member, said collar thereby bonding said element to said member.

10. A method of fabricating a thermocouple assembly, said method comprising the steps of fixturing a thermoelectric element to a metal terminal member so that said element and said member are in good thermal and electrical contact thereby forming a thermoelectric junction, immersing said fixtured assembly in an electroplating bath for a time sufficient to form a metal collar around the periphery of said junction to tightly bond said element to said member, and subsequently removing said assembly from said bath.

11. A method of fabricating a thermocouple assembly having a plurality of high strength, low resistance thermoelectric junctions, said method comprising the steps of positioning a p-type semiconductor element between and in good thermal and electrical contact with two metal terminal members to form a p-type thermocouple arm having hot and cold thermoelectric junctions, positioning an n-type semiconductor element between and in good thermal and electrical contact with two metal terminal members to form an n-type thermocouple arm having hot and cold thermoelectric junctions, immersing said arms in an electroplating bath for a time sufficient to deposit a tightly adherent metal collar around the periphery of said junctions so that said elements are tightly bonded to said members, removing said arms from said bath, and electrically connecting said arms.

12. A method of fabricating a thermocouple assembly, said method comprising the steps of fixturing an n-type semiconductor element between and in good thermal and electrical contact with two metal terminal members to form a thermocouple arm having hot and cold thermoelectric junctions, assembling a p-type semiconductor element between and in good thermal and electrical contact with two metal terminal members to form a p-type thermocouple arm having hot and cold thermoelectric junctions, each of said elements being formed of at least one metal selected from the group consisting of germanium telluride, lead telluride and bismuth telluride, each of said members being formed of at least one metal selected from the group consisting of nickel, copper, iron and steel, immersing said assembled thermocouple arms in an electroplating bath for a time sufficient to form a metal collar around the periphery of said junctions to tightly bond said elements to said members, each of said collars being formed of at least one metal selected from the group consisting of nickel, rhodium, silver, copper and iron, removing said fixtured arms from said bath, electrically connecting said n-type arm with said p-type arm by soldering a metal strap to the terminal members on each of said arms contiguous and hot thermoelectric junctions, and affixing terminal straps to said terminal members contiguous said cold thermoelectric junctions, said straps being made from at least one metal selected from the group consisting of copper, iron and steel.

References Cited by the Examiner

UNITED STATES PATENTS

| | | | |
|---|---|---|---|
| 262,111 | 8/1882 | Patterson | 136—5 |
| 1,625,604 | 4/1927 | Hersee | 204—16 |
| 2,333,567 | 11/1943 | Helmore | 204—16 |
| 2,741,571 | 4/1956 | Chase et al. | |
| 3,040,539 | 6/1962 | Gaugler | 136—4.2 |

WINSTON A. DOUGLAS, *Primary Examiner.*

A. B. CURTIS, *Assistant Examiner.*

---

UNITED STATES PATENT OFFICE

CERTIFICATE OF CORRECTION

Patent No. 3,279,955 October 18, 1966

Edwin J. Miller et al.

It is hereby certified that error appears in the above numbered patent requiring correction and that the said Letters Patent should read as corrected below.

Column 3, line 27, for "thermoelectrical" read -- thermoelectric --; column 10, line 20, for "and" read -- said --.

Signed and sealed this 12th day of September 1967.

(SEAL)

Attest:

ERNEST W. SWIDER

Attesting Officer

EDWARD J. BRENNER

Commissioner of Patents

UNITED STATES PATENT OFFICE

CERTIFICATE OF CORRECTION

Patent No. 3,279,955 October 18, 1966

Edwin J. Miller et al.

It is hereby certified that error appears in the above numbered patent requiring correction and that the said Letters Patent should read as corrected below.

Column 3, line 27, for "thermoelectrical" read -- thermoelectric --; column 10, line 20, for "and" read -- said --.

Signed and sealed this 12th day of September 1967.

(SEAL)
Attest:

ERNEST W. SWIDER
Attesting Officer

EDWARD J. BRENNER
Commissioner of Patents